(12) United States Patent
Kamada

(10) Patent No.: US 6,943,433 B2
(45) Date of Patent: Sep. 13, 2005

(54) SEMICONDUCTOR DEVICE AND MANUFACTURING METHOD FOR SAME

(75) Inventor: Kazuhiro Kamada, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/318,409

(22) Filed: Dec. 13, 2002

(65) Prior Publication Data

US 2003/0168720 A1 Sep. 11, 2003

(30) Foreign Application Priority Data

Mar. 6, 2002 (JP) .......................................... 2002-060153
Nov. 8, 2002 (JP) .......................................... 2002-325921

(51) Int. Cl.⁷ ........................ H01L 23/495; H01L 23/02
(52) U.S. Cl. ...................... 257/666; 257/675; 257/676; 257/680; 257/687
(58) Field of Search .................................. 257/666, 675, 257/676, 678, 680, 687

(56) References Cited

U.S. PATENT DOCUMENTS

| | | | | |
|---|---|---|---|---|
| 5,039,719 A | * | 8/1991 | Watanabe et al. ............ 523/213 |
| 5,091,341 A | * | 2/1992 | Asada et al. ................... 29/827 |
| 5,596,231 A | * | 1/1997 | Combs ........................ 257/776 |
| 5,750,421 A | * | 5/1998 | Kasai et al. ................. 438/106 |
| 5,977,626 A | * | 11/1999 | Wang et al. ................. 257/707 |
| 6,274,924 B1 | | 8/2001 | Carey et al. |
| 6,476,469 B2 | * | 11/2002 | Hung et al. .................. 257/676 |
| 6,482,664 B1 | * | 11/2002 | Lee et al. ...................... 438/28 |
| 6,501,156 B1 | * | 12/2002 | Nakanishi et al. .......... 257/666 |
| 6,559,379 B2 | * | 5/2003 | Solanki et al. ............. 174/52.2 |
| 6,666,392 B2 | * | 12/2003 | Hirano et al. ................. 241/21 |
| 2001/0022390 A1 | | 9/2001 | Waitl et al. |
| 2003/0080341 A1 | * | 5/2003 | Sakano et al. ................ 257/79 |

FOREIGN PATENT DOCUMENTS

| | | |
|---|---|---|
| EP | 1 156 535 A1 | 11/2001 |
| JP | 5-335442 | 12/1993 |
| JP | 7-106636 | 4/1995 |
| JP | 8-148724 | 6/1996 |
| JP | 11-298049 | 10/1999 |
| JP | 2000-150967 | 5/2000 |
| JP | 2001-168400 | 6/2001 |
| JP | 3083557 | 11/2001 |
| JP | 2002-520823 | 7/2002 |
| WO | WO 00/02262 | 1/2000 |
| WO | WO 01/43205 A1 | 6/2001 |

* cited by examiner

*Primary Examiner*—T. N. Quach
(74) *Attorney, Agent, or Firm*—Morrison & Foerster LLP

(57) ABSTRACT

To provide a light emitting device having a high reliability wherein no resin burrs occur, The semiconductor device comprises a semiconductor element, a package having a recess for housing the semiconductor element and a mold member for sealing the semiconductor element in the recess and the package comprises lead electrodes and a package support part supporting the lead electrodes so that main surfaces of the tip portions of the lead electrodes are exposed from the bottom surface of the recess.

17 Claims, 6 Drawing Sheets

SEMICONDUCTOR DEVICE AND MANUFACTURING METHOD FOR SAME

BACKGROUND OF THE INVENTION

1. Field of the Invention

The present invention relates to a resin molding method of a semiconductor device utilizing a semiconductor element, such as a light emitting element or a light receiving element, in particular, to a technology for high quality transfer molding wherein resin burrs do not occur at the time of transfer molding using a resin material for covering a package wherein a light emitting element is mounted.

2. Description of the Background Art

A transfer molding method has been utilized as a method for sealing an LED chip in a resin mold. According to this method, which is a resin molding method of a semiconductor device, a semiconductor element is mounted on a lead frame, and this semiconductor element and lead electrodes are connected so that, in the resulting state, a space that includes this semiconductor element is formed by engaging an upper die and a lower die and, after that, resin is injected into this enclosed space so as to cover the surface of the lead electrodes and, then, the semiconductor element is sealed into resin when the resin is hardened.

Furthermore, such a transfer molding method includes a method for preventing resin burrs on lead electrodes wherein a die is made to make contact with the lead electrodes provided on a rigid substrate made of glass epoxy, or the like, and resin is injected through a gap created between the die and the substrate so that the resin is prevented from leaking out onto the surface of the lead electrodes (see, for example, Japanese unexamined patent publication H8 (1996)-148724).

In addition, a light emitting element is mounted on the bottom surface of a recess, created so that the opening becomes broader closer to the top, in order to increase the output efficiency of the light that has been emitted from the light emitting element, and the positive and negative electrodes of the light emitting element are connected to lead electrodes for supplying power to the light emitting element through wires and, after that, a mold is formed so as to seal the light emitting element in resin.

According to a method for injecting resin by utilizing lead electrodes, however, excess portions of a mold occurring when resin moves into a gap between dies, creating so-called resin burrs, cannot be completely prevented. According to a method wherein a die is made to make contact with lead electrodes provided on a rigid substrate made of, for example, glass epoxy, or the like, a slight gap occurs between the mold and the lead electrode and, when mold material having great fluidity is made to flow into the die, the material leaks out, even from the slight gap, onto the surface of the package and onto the surface of the lead electrodes causing the occurrence of resin burrs. The external appearance of the light emitting device is negatively affected due to resin burrs occurring in the manner and, in addition, these resin burrs become a hindrance at the time when the electrodes are processed in subsequent steps. Thereby, the task of shaving off the resin burrs with a file, or the like, becomes necessary and such task of removing the resin burrs takes much time and effort. Therefore, it is necessary to follow a method wherein no resin burrs occur in the formation process of a mold material.

In addition, in the case that a light emitting element is mounted on the bottom surface of a recess, created so that the opening becomes broader closer to the top in order to increase the output efficiency of the light emitted from the light emitting element, and, then, a mold member is formed over the light emitting element, the mold member after formation has a convex form that protrudes inward toward the package and, therefore, the mold portion is easily removed from the package and problem arises wherein a light emitting device of a high reliability cannot be formed.

DISCLOSURE OF THE INVENTION

The present invention is provided in view of such problems and a purpose thereof is to provide a light emitting device having a high reliability wherein no resin burrs occur.

A first semiconductor device according to the present invention has a semiconductor element, a package having a recess for housing the semiconductor element and a mold member for sealing the semiconductor element in the recess. The package has lead electrodes and a package support part supporting the lead electrodes so that main surfaces of the tip portions of the lead electrodes are exposed from the bottom surface of the recess.

The first semiconductor device is characterized in that the mold member extends to at least between the lead electrodes and the package support part.

According to such a configuration, the mold member does not easily come off from the package and, thereby, a semiconductor device having a high reliability can be gained. That is to say, in the case wherein the extending portion does not exist, the mold member easily comes off from the package when force is applied to the mold member so that the mold member is pulled in the direction toward the front of the semiconductor device. In the case wherein the extending portion is provided as in the present invention, however, this extending portion extends in the direction perpendicular to the force and, therefore, the mold member can be prevented from coming off of the package.

In addition, a second semiconductor device according to the present invention has a semiconductor element, a package having a recess for housing the semiconductor element, a plurality of conductors for connecting the lead electrodes and electrodes of the semiconductor element and a mold member for sealing the semiconductor element in the recess. The package has lead electrodes and a package support part holding the lead electrodes so that main surfaces of the tip portions of the lead electrodes are exposed from the bottom surface of the recess, The second semiconductor device is characterized in that the main surfaces of the tip portions exposed from the bottom surface of the recess are separated from each other by the package support part extending from the side of the recess and the conductors are connected to these separated and exposed portions respectively.

According to such a configuration, a semiconductor device having a high reliability can be gained.

In addition, in the first and second semiconductor devices according to the present invention, it is preferable for the package to have a heat sink of which the back side becomes a mounting surface portion and of which the main surface becomes a portion on which the semiconductor element is placed.

According to such a configuration, heat from the semiconductor element can be efficiently released to the outside without being held within the package and, thereby, it is possible to optically control, with ease, light of a high output power emitted from a light emitting element or light to be collected by a light receiving element by means of a mold member that is fabricated in a desired form.

In addition, in the semiconductor device having the heat sink, it is preferable for the heat sink to have a recess on the main surface side.

According to such a configuration, heat from the semiconductor element can be efficiently released to the outside without being held within the package and, in addition, the light emitted from the light emitting element is reflected from the side of the recess so as to be directed in the frontal direction of the semiconductor device and, therefore, it becomes possible to increase the output efficiency of the light of the semiconductor device.

In addition, in the semiconductor device having the heat sink, it is preferable for the heat sink to have a protrusion on the side making contact with the package.

According to such a configuration, that is to say, according to the form of the heat sink unique to the present invention, thermoplastic resin, which is the material of the package, holds the heat sink in a secure manner when hardened and, therefore, the heat sink in the semiconductor device according to the present invention does not come off from the package, so that it becomes possible to gain a semiconductor device having a high reliability. Conventionally, since a heat sink formed in a separate process is adhered to the package with an insulating adhesive, or the like, the efficiency of the task is low and the adhered heat sink easily comes off from the package so that a problem arise wherein a light emitting device having a high reliability cannot be gained.

Furthermore, it is preferable in the first and second semiconductor devices according to the present invention for the package to have notches that are created in upper end portions of a pair of sides opposed to each other and that go through the sides reaching to the side of the recess.

According to such a configuration, the mold member extends from the recess to the notches so as to prevent the mold member from coming off of the package even in the case that force is applied to the mold member in the direction toward the mounting surface of the semiconductor device and, therefore, it is possible to form a semiconductor device having a high reliability.

The first and second semiconductor devices according to the present invention are the semiconductor devices according to claims 1 to 6, characterized in that the package support part is made of a thermoplastic material.

According to such a configuration, the outer periphery of the lead electrodes can be held and secured primarily by thermoplastic resin having a thermal expansion coefficient lower than that of the mold member and, thereby, resistance of the semiconductor device to thermal shock can be increased.

A manufacturing method for a semiconductor device according to the present invention is a manufacturing method for a semiconductor device having: a semiconductor element; a package having a recess for containing lead electrodes and the semiconductor element and that is held by a package support part so that main surfaces of the tip portions of the lead electrodes are exposed from the bottom surface of the recess; and a mold member for sealing the semiconductor element contained in the recess, wherein the manufacturing method is characterized by including:

the first step of forming a lead frame having protrusions opposed to each other and separated from each other in one direction and of forming a pair of lead electrodes protruding in a direction differing from the direction by carrying out a punching out process on a metal plate; the second step of carrying out a pressing process on the main surface side of the lead electrodes so that the tip portions thereof are placed below the lead frame; the third step of integrally forming a package by placing the metal plate between an upper die and a lower die, which can be engaged with the upper die, and by injecting a thermoplastic material, wherein the upper die has a protruding portion at the center and has protrusions provided so as to oppose each other on the upper edge of the sides and has a pair of protrusions on the lower portions of the other pair of sides; the fourth step of placing, and electrically connecting, the semiconductor element within a recess of the package gained in the third step; and the fifth step of sealing the recess with a mold material by allowing the mold material to pass from the upper surface of the lead frame into the recess at a temperature of the melt point, or above, of the thermoplastic material and, then, of hardening the thermoplastic material.

According to such a configuration, it is possible to easily form a semiconductor device without allowing resin burrs to occur by utilizing a transfer molding process. In addition, according to the third step, the outer periphery of the lead electrodes is held and secured primarily by thermoplastic resin having a thermal expansion coefficient lower than that of the mold member and, thereby, the resistance of the semiconductor device to thermal shock can be increased.

In addition, in the fifth step of the manufacturing method for a semiconductor device according to the present invention, it is preferable for the package to be held by the sides by means of a hangar lead in the direction of the sides of the lead electrodes.

According to such a configuration, it is possible to easily form a semiconductor device without allowing resin burrs to occur by utilizing a transfer molding process. In particular, the hangar lead according to the present invention can prevent the mold material from leaking out of portions on the sides of the package, into which lead electrodes are inserted, at the time when this mold material is injected into the package recess.

As described above, even in the case wherein, for example, a light emitting element is placed on the bottom surface of a recess, created so that the opening becomes broader closer to the top in order to increase the output efficiency of the light emitted from the light emitting element, and the mold member formed over the light emitting element has a convex shape protruding inward toward the package, the mold portion or the light emitting element, together with the mold member, do not easily come off of the package and, therefore, a high reliability can be maintained.

In addition, the occurrence of resin burrs can be completely prevented in the resin formation process in accordance with the manufacturing method for a semiconductor device according to the present invention. Therefore, the task of removal of resin burrs become unnecessary, so that it is possible to increase the task efficiency and, in addition, no problem arises wherein the external appearance of the light emitting device is negatively affected.

BEST MODE FOR CARRYING OUT THE INVENTION

In the following, the modes of the present invention are described in reference to the figures. Herein, the modes described below illustrate a light emitting device embodying the technical idea of the present invention and the light emitting device of the present invention is not limited to the modes described below. In addition, some of the sizes and positional relationships of the members shown in the respective drawings are exaggerated in order to clarify the description.

Figure 1A:
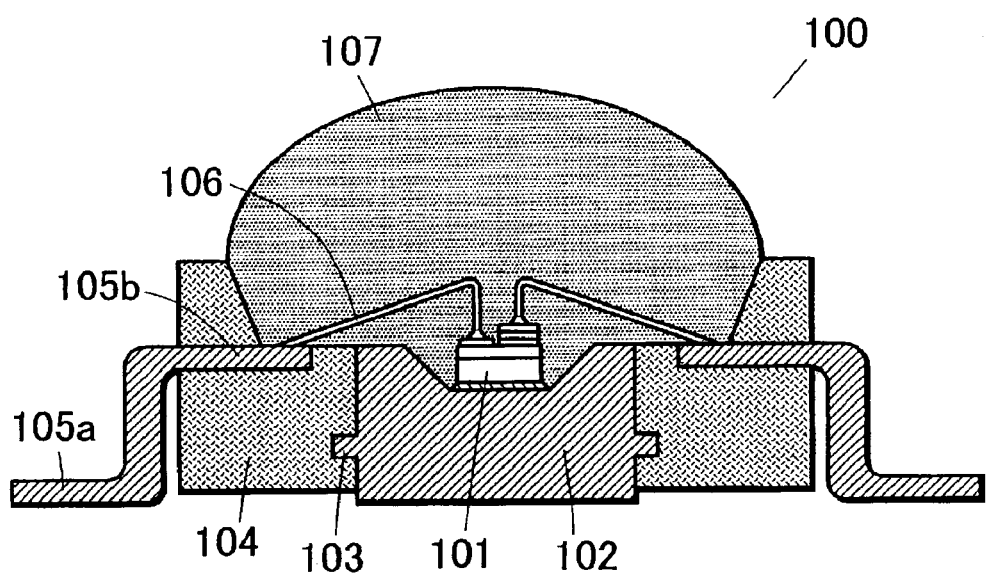
FIG. 1A is a schematic cross sectional view showing one embodiment of the present invention.
Figure 2:
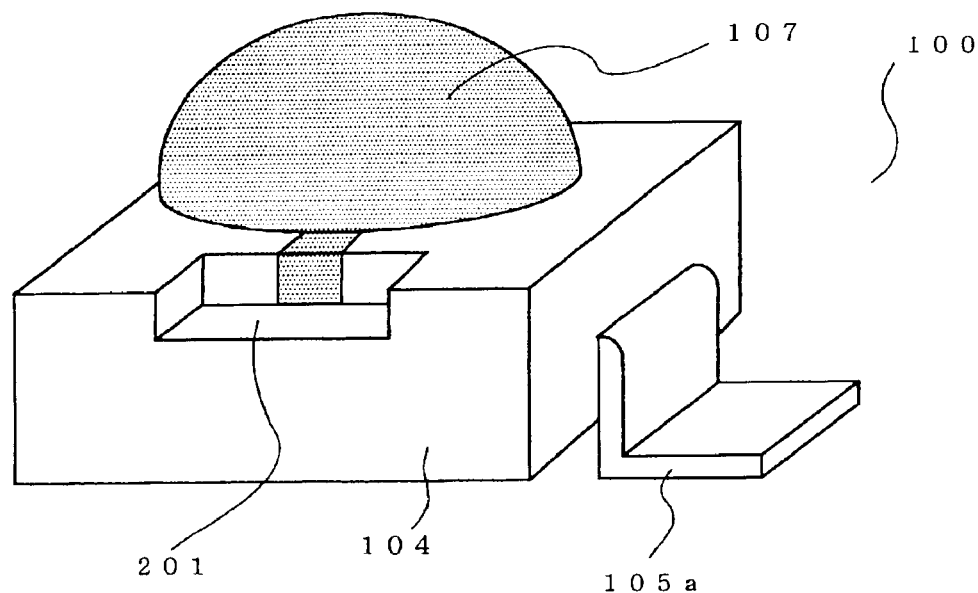
FIG. 2 is a schematic perspective view showing one embodiment of the present invention.
Figure 1B:
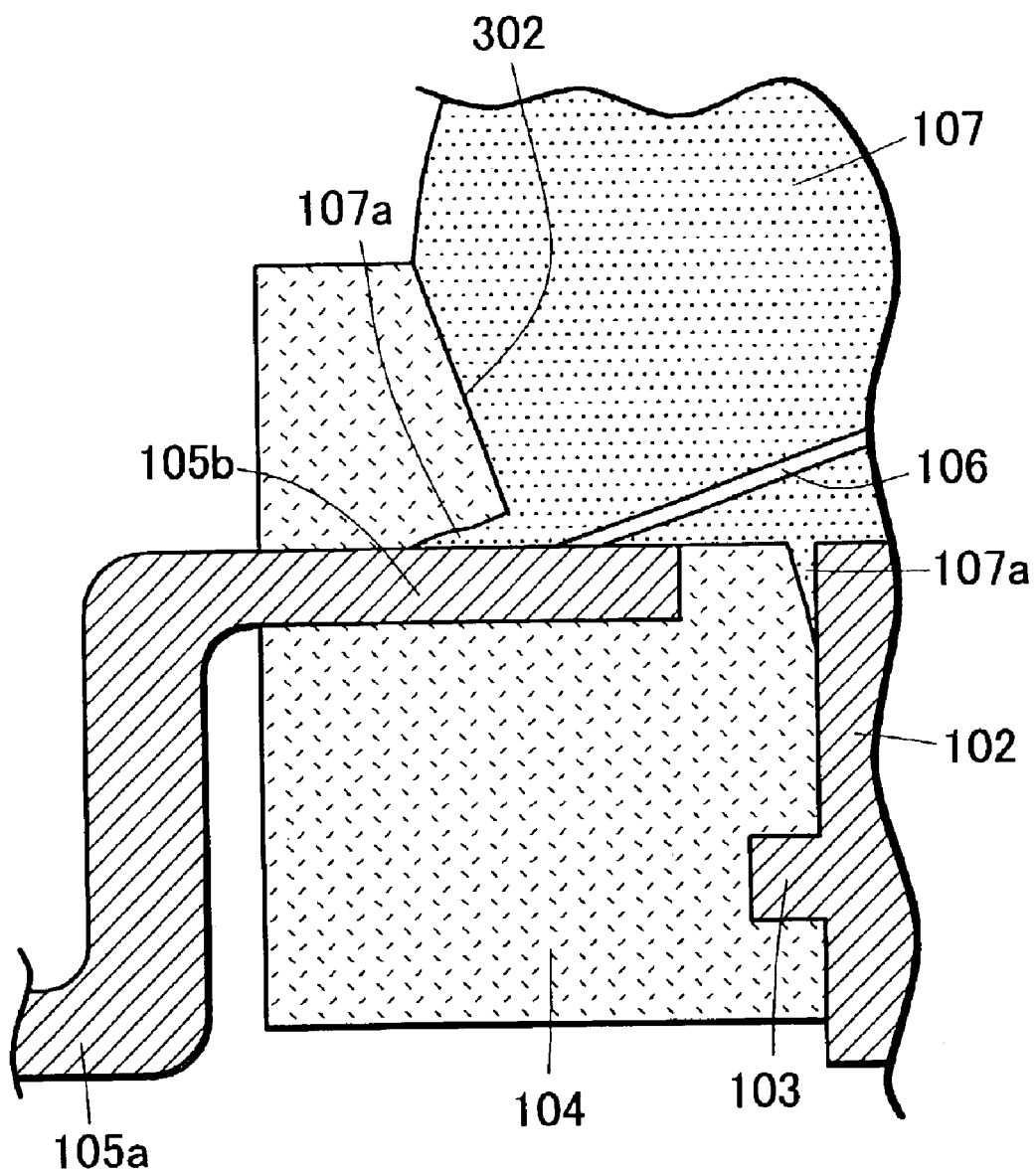
FIG. 1B is a schematic cross sectional view showing an enlarged portion of FIG. 1A.

As shown in FIGS. 1A, 1B and 2, the semiconductor device according to the present invention is formed so as to be provided with a package having a recess 302, an LED chip 101 and a mold member 107.

In the present mode, the package is provided with lead electrodes 105, a heat sink 102 and a package support part 104, wherein lead electrodes 105 and heat sink 102 are held and secured by package support part 104 so that the main surfaces of the tip portions of lead electrodes 105 are exposed from the bottom surface of recess 302 and so that the main surface of the heat sink is exposed from the bottom surface of the recess while the back surface, opposed to this main surface, is exposed from the mounting surface side of the package.

In addition, the package has a pair of notches 201 on the main surface side.

Furthermore, a recess, on which an LED chip 101 is mounted, is created in the main surface of the heat sink, which is exposed from the bottom surface of recess 302. The containment portion for LED chip 101 has, in the manner, a two-stage configuration made of recess 302 and the recess created in the main surface of the heat sink in the package of the present mode.

Then, LED chip 101 is mounted on the bottom surface of the recess in heat sink 102 and the positive and negative electrodes of this LED chip 101 are electrically connected to lead electrodes 105 by means of conductive wires 106.

Furthermore, a mold member 107 covers and seals LED chip 101 and conductive wires 106 so as to protect them from the external environment.

In addition, mold member 107 is formed in a lens form so as to collect light emitted from semiconductor device 100 and extends into gaps occurring between the surfaces of inner lead electrodes 105b and package support part 104 at the time of forming and into gaps occurring between heat sink 102 and package support part 104 (extending portion 107a in FIG. 1B). In addition, though the mold member 107 and package 104, respectively, are formed in accordance with the transfer molding process, the former is formed of a thermosetting resin while the latter is formed of a thermoplastic resin.

In the following, the respective components of the mode of the present invention are described in detail.

(LED chip 101)

The semiconductor element utilized in the present invention may be considered a semiconductor element such as a light emitting element or a light receiving element and the semiconductor element utilized in the present mode is an LED chip 101 used as a light emitting element. In the case that a fluorescent material and a light emitting element are combined so as to gain a light emitting device for emitting light of which the wavelength has been converted by excitation of the fluorescent material, an LED chip that emits light having a wavelength that can excite the fluorescent material is utilized. A semiconductor, such as GaAs, InP, GaAlAs, InGaAlP, InN, AlN, GaN, InGaN, AlGaN, InGaAlN, or the like, is formed as a light emitting layer on a substrate in accordance with an MOCVD method, or the like, in LED chip 101. As for the structure of the semiconductor, a homostructure, a heterostructure or a double heterostructure having an MIS junction, a PIN junction or a PN junction can be cited. A variety of emission light wavelengths can be selected depending on the material or the degree of mixed crystallization of the semiconductor layer. In addition, a single quantum well structure or a multiple quantum well structure, wherein the semiconductor active layer is formed in a thin film having quantum effects, can be used. Preferably, the semiconductor layer is made of a nitride-based compound semiconductor (general formula of $In_iGa_jAl_kN$, here $0 \leq i$, $0 \leq j$, $0 \leq k$ and $i+j+k=1$) that can efficiently emit light having a comparatively short wavelength sufficient to excite the fluorescent material.

In the case that a gallium nitride-based compound semiconductor is used, a material such as sapphire, spinel, SiC, Si, ZNO, GaN, or the like, is preferably used as the semiconductor substrate. It is particularly preferable to use a sapphire substrate in order to form gallium nitride having a good crystallinity. In the case that a semiconductor film is made to grow on a sapphire substrate, it is preferable to form a gallium nitride semiconductor having a PN junction on top of a buffer layer, such as of GaN, AlN, or the like, formed on the substrate. In addition, a GaN single crystal alone can be utilized as a substrate that is selectively made to grow on a sapphire substrate using $SiO_2$ as a mask. In this case, the light emitting element and the sapphire substrate can be separated by etching and removing $SiO_2$ after formation of the respective semiconductor layers. Gallium nitride-based compound semiconductors show N-type conductivity in the condition wherein no impurities have been doped. In the case that the desired N-type gallium nitride semiconductor, wherein the light emission efficiency has been increased, is formed, it is preferable to appropriately introduce an N-type dopant such as Si, Ge, Se, Te, C, or the like. On the other hand, in the case that a P-type gallium nitride semiconductor is formed, Zn, Mg, Be, Ca, Sr, Ba, or the like, is doped as a P-type dopant.

Gallium nitride-based compound semiconductors are not easily converted to the P-type solely by the doping of a P-type dopant and, therefore, it is preferable to convert such semiconductors to the P-type by means of annealing, such as by heating in a furnace, by low speed electronic beam irradiation or by plasma irradiation, after the introduction of a P-type dopant. As for the specific layer structure of the light emitting element, a preferable structure can be cited wherein an N-type contact layer, which is a gallium nitride semiconductor, an N-type clad layer, which is an aluminum gallium nitride semiconductor, an active layer, which is an indium gallium nitride semiconductor to which Zn and Si have been doped, a P-type clad layer, which is an aluminum gallium nitride semiconductor, and a P-type contact layer, which is a gallium nitride semiconductor, are layered on top of a sapphire substrate, or on top of silicon carbide, having a buffer layer formed of gallium nitride, aluminum nitride, or the like, that are grown at low temperature. In the case of LED chip 101, which has a sapphire substrate, surfaces of the P-type semiconductor and the N-type semiconductor are exposed by means of etching, or the like, and, after that, the respective electrodes in a desired form are formed on the semiconductor layer using a sputtering method or a vacuum vapor deposition method in order to form LED chip 101. In the case of an SiC substrate, a pair of electrodes can be formed by utilizing the conductivity of the substrate itself.

Next, a semiconductor wafer, or the like, on which semiconductor devices are formed, is directly fully cut with a dicing saw wherein a blade with the tip made of diamond rotates or is cut so as to have trenches with a width that is greater than the width of the blade tip (half cut), and the semiconductor wafer is cracked through the application of an external force. Alternately, a scriber, of which the diamond needle at the tip moves in a reciprocating linear manner, is used to draw very fine scribing lines in, for example, a grid form on the semiconductor wafer and, after that, the wafer is cracked through the application of an external force and, thereby, the semiconductor wafer is cut into chip forms. LED chip 101, made of a nitride-based compound semiconductor, can be formed in such a manner.

In the case that the fluorescent material is excited so as to emit light in the light emitting device of the present invention, it is preferable for the wavelength of the main emission light of LED chip 101 to be no less than 350 nm and no greater than 530 nm, taking the complementary color, and the like, of the fluorescent material into consideration.

(Frame 300)

Figure 3:
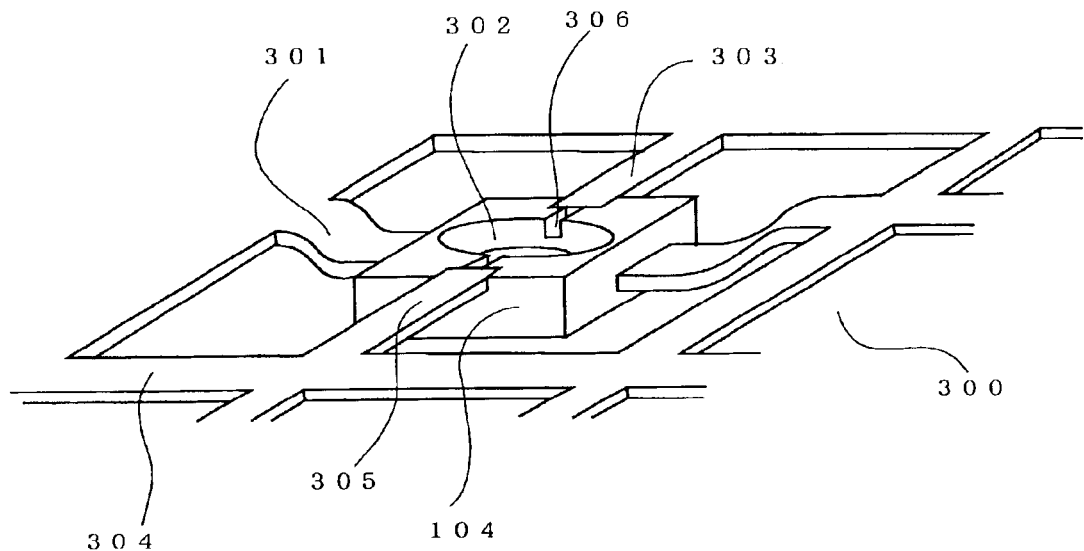
FIG. 3 is a schematic view showing the external appearance of a frame utilized in one embodiment of the present invention.

FIG. 3 shows a perspective view of a frame utilized as an embodiment in the present mode. A frame 300 utilized in the present mode is provided with a lead frame (hereinafter referred to as "injection frame") 305 that allows mold material to pass through the top surface thereof at the time when the mold material is injected into a space to be filled in each package, an air vent frame 303 that allows the replaced gas to escape from the space to be filled at the time when the mold material is injected, lead electrodes 301 for forming outer lead electrodes 105a by being separated from the frame in a subsequent process and a hangar lead for holding the package by the sides in order to prevent the injected mold material from leaking out, wherein these are connected to an external frame 304. In further detail, a pair of lead electrodes protrude from the external frame so as to be opposed to each other and so as to be separated from each other, and aligned along the same axis, and a pair of lead frames (injection frame and air vent frame) protrude from the external frame so as to be opposed to each other and so as to be separated from each other, and aligned along the same axis in a direction differing from that of these lead electrodes. Furthermore, press processing is applied to the lead electrodes from the main surface side of the package that is to be formed in a subsequent process and, thereby, the tip portions of the pair of lead electrodes are positioned below the pair of lead frames.

Several of, to several tens of, packages are formed from one frame and, in addition, several of, to several tens of, light emitting devices are formed. At this time, it is possible to form light emitting devices having mold members of which the forms, or sizes, differ on one frame 300 by changing the forms of corresponding dies.

As for the material of the frame, an iron-based or copper-based alloy is, in general, preferable and copper, which has a high thermal conductivity, in particular, is used in the present mode wherein it is preferable to plate the surface of the frame with metal, such as with silver, or the like. It is possible to increase the efficiency of the light output of the light emitting device by carrying out such metal plating in order to increase the reflection of light outputted from the LED chip.

(Package)

A package support body 104 has a recess in which a semiconductor element is mounted and works as a support body for holding and securing lead electrodes within this recess that allow an electrical connection to the outside. A plurality of the same types, or different types, of semiconductor elements that are the same as the semiconductor element or of semiconductor elements that are different from the semiconductor element can be mounted in combination in a package according to the present invention by adjusting the size of the recess. It is possible, for example, to mount, together with the semiconductor element, a protective element (Zener diode, condenser, or the like) to prevent damage to the semiconductor element due to static electricity, surge voltage, or the like, within the recess.

In the present mode, the lead electrodes protrude from the sides of package support body 104. In addition, the package has a heat sink in order to increase radiation of heat from the semiconductor element or from the light emitting device. A plurality of openings may be provided to the package corresponding to the numbers, and sizes, of LED chips 103. In addition, in the case wherein light emitting devices are utilized as display components, the devices are preferably made to be of a dark color, such as black, grey, or the like, or the light emitting surface side of package support body 104 is made to be of a dark color in order to add light blocking effect. A mold member 107, which is a light transmitting protector, can be provided to the package in order to further protect LED chip 101 from the external environment. It is preferable for the package, in particular for package support body 104, to have good adhesion to mold member 107 and it is desirable for the package to have insulation in order to electrically shield LED chip 101 from external influence. Furthermore, the package and mold member 107 both have low thermal expansion coefficients, and it is preferable for the coefficients to be approximately equal to each other. In particular, it is preferable for package support body 104 to have a thermal expansion coefficient lower than that of mold member 107, taking into consideration the case wherein thermal effects are received from LED chip 101, or the like. In such a configuration the lead electrodes, held and secured primarily by the package support body, control the effects from the mold member when the mold member expands or contracts when receiving the effects of thermal stress so as to mitigate the thermal stress and only slightly shift causing no problems, such as disconnection of conductive wires, and, therefore, it is possible to form a light emitting device of a high reliability and the manufacturing yield can be increased.

The inner wall surface of recess 302 of the package may be of a satin finish so that the area of adhesion with the mold member can be increased or plasma processing can be applied to the inner wall surface of recess 302 of the package so as to increase the tightness of the contact with the mold member. Though package support body 104 is integrally formed with heat sink 102 and lead electrodes 105 in the present mode, another mode may be formed by combining the package support body with lead electrodes and a heat sink by means of engagement, or the like. Here, though the form of the package in the drawings attached to the present specification is a rectangular parallelepiped provided with a recess, it may be an arbitrary three-dimensional form. In addition, a pair of notches 201 are provided in the upper portion of the package support body so as to face two sides opposite to each other and the tip portions of the frames are mounted at the time of formation of a mold member so as to make contact with these notches 201 and so as to be caught by them. These notches 201 are fabricated at the same time as the formation of the package in a form wherein the tips of the frames can easily be removed in a subsequent process by utilizing the forms of the frame tips, that is to say, by making the frame tip portions protrude into the space to be filled. Furthermore, gates 306, respectively, are provided in the upper portions of package support body 104 so that notches 201, provided so as to be opposed to each other, penetrate into the recess. A cross section of these gates 306 has the same size as, or is smaller than, notches 201 in order to increase the task efficiency and in order to prevent the occurrence of resin burrs and, in addition, maintains the minimum size that allows the mold material, in a liquid form, to smoothly pass through. In addition, the cross section of gates 306 is limited to a size such that the mold material, which has hardened within these gates, can be easily cut at the time the lead frames and the die are removed after the molding process. Moreover, one of these gates 306 is provided as an injection gate that becomes an inlet for the mold material to be injected into the space to be filled while the other gate is provided as an air vent for gas to be replaced with the resin material of mold member and to be expelled from the space to be filled. Since the package has such a form, it becomes possible to prevent the leakage of resin to be injected at the time of formation of the mold member and a light emitting device wherein gas bubbles are not included in the mold member can be formed without the occurrence of resin burrs. In addition, the material of the mold member moves into gates 306 at the time of molding and is hardened. The mold member extends from the recess to gates 306 in such a manner and, thereby, the mold member does not easily come off of the package, which is preferable, even in the case wherein an external force is applied to the mold member in the direction toward the mounting surface of the light emitting device.

Such a package support body 104 can be formed in a comparatively easy manner according to a transfer molding process, insert molding, or the like. Thermoplastic resins such as aromatic nylon-based resin, polyphthalamide resin (PPA), sulfone-based resin, polyamideimide resin (PAI), polyketone resin (PK), polycarbonate resin, polyphenylene-sulfide (PPS), liquid crystal polymer (LCP), ABS resin, PBT resin, and the like, can be used as the thermoplastic material of the package support body. Here, glass fiber may be included in these thermoplastic resins so as to be utilized as the thermoplastic material. It is possible to form a package support body having high rigidity and great strength by including glass fibers in the resin as described above.

It is possible to prevent resin leakage in the process wherein a thermosetting member, which is the material of a mold member, is made to flow into the die by utilizing the thermoplastic resin. In addition, the thermal expansion coefficient of the package support body material is lower than the thermal expansion coefficient of the material of the mold member at the time of hardening. Therefore, even in the case wherein the light emitting device is utilized under weather conditions wherein variation in temperature is great and the mold member contracts due to cold or expands due to heat, the lead electrodes held by, and secured to, the package support body is not greatly affected by thermal stress occurring in the mold member and, therefore, it is possible to prevent the disconnection of the conductive wires bonded to the lead electrodes. Here, the thermoplastic resin in the present specification means a substance having a linear polymeric structure that softens and, then, liquefies when heated and hardens when cooled. Styrene-based, acryl-based, cellulose-based, polyethylene-based, vinyl-based, nylon-based, carbon fluoride-based resins are, for example, cited as types of the thermoplastic resin.

In addition, a variety of dyes and pigments, preferably, are used as coloring agents for making package support body 104 of a dark color. Concretely, $Cr_2O_3$, $MnO_2$, $Fe_2O_3$, carbon black, or the like, are cited as being preferable.

LED chip 101 and package support body 104 or the heat sink can be adhered to each other using a thermosetting resin, or the like. Concretely, an epoxy resin, an acryl resin, an imide resin, and the like, can be cited. In addition, an Ag paste, a carbon paste, an ITO paste, a metal bump, and the like, preferably are used in order to secure LED chip 101 in place and in order to electrically connect LED chip 101 to lead electrodes 104 within the package.

(Lead Electrodes 105)

Lead electrodes 105 are members utilized to supply power from the outside of the package to LED chip 101 located inside of the package. Lead electrodes 105 according to the present mode, fabricated from a pair of lead electrodes 301, are formed of outer lead electrodes 105a, which are portions protruding from sides of the package support body, and inner lead electrodes 105b, which penetrate through the sides of the package support body so as to extend into the recess in the package. At the time of the formation of the mold member, outer lead electrodes 105a protruding from the sides of the package support body are connected to an external frame 304, which supports the respective frames. In addition, lead electrodes 105 can be formed so as to have a variety of sizes, taking heat radiation, electrical conductivity, the properties of LED chip 101, and the like, into consideration. Lead electrodes 105 define the position of LED chip 101 and it is preferable for lead electrodes 105 to have excellent thermal conductivity in order to release heat emitted by LED chip 101 to the outside. According to such a configuration, it is possible for the present mode provided with a heat sink for the purpose of increase in heat radiation of the light emitting element to further increase heat radiation from the entire light emitting device. As for the concrete value of the electrical resistance of lead electrodes 105, 300 $\mu\Omega\cdot cm$, or less, is preferable and 3 $\mu\Omega\cdot cm$, or less, is more preferable. In addition, as for the concrete value of the thermal conductivity, 0.01 $cal/(s)(cm^2)(°C./cm)$, or greater, is preferable and 0.5 $cal/(s)(cm^2)(°C./cm)$, or greater, is more preferable.

Lead electrodes wherein metal plating, such as of silver, palladium, or gold, or solder plating is impressed on a copper or phosphor bronze surface are preferably used as lead electrodes 105, described above. In the case of silver plating, the reflectance of light emitted from the light emitting element becomes high and the efficiency of the light output of the light emitting device increases, which is preferable. In the present invention wherein lead electrodes 301, which are portions of the frame, are utilized as lead electrodes 105 of the light emitting device, a variety of types of lead electrodes can be utilized, depending on the electrical conductivity or thermal conductivity, but it is preferable for the plate thickness of the lead electrodes to be 0.1 mm to 2.0 mm from the point of view of ease of processing.

In addition, it is preferable to form the package support body so that the respective lead electrodes, making up a pair, become bifurcated in the vicinity of the outer sides of the package support body and are inserted into the package support body. In such a configuration, excessive stress applied to the package from the lead electrodes in the forming is mitigated and the thermoplastic resin, which is the material of the package, enters between the two lead electrodes and, thereby, the lead electrodes strongly secured to the package support body. Furthermore, the closeness of the contact of the upper die and the lower die, which are utilized at the time of formation of the package support body, becomes greater and it becomes possible to prevent the two dies from sliding vis-à-vis each other during the formation process of the package support body.

(Heat Sink 102)

In the present mode, heat sink 102 has functions wherein the main surface side exposed from the bottom of the recess in the package allows LED chip 101 to be mounted thereon and, at the same time, allows the heat emitted from this LED chip to be released to the outside of the light emitting device from the back surface, which is a portion of the mounting surface of the light emitting device. In addition, in the present mode a thermoplastic resin is utilized as the material of package support body 104 and, therefore, a high heat radiation effect is required and heat sink 102 allows the enhancement of the heat radiation effect of the package so as to form a light emitting device having a high reliability.

Heat sink 102 can be formed in a variety of sizes, taking heat radiation, the properties of LED chip 101, and the like, into consideration. LED chip 103 is placed on the heat sink and, therefore, it is preferable for the heat sink to have an excellent thermal conductivity in order to release heat emitted by LED chip 101 to the outside. As for the concrete value of the thermal conductivity, 0.01 cal/(s)(cm$^2$)(° C./cm), or greater, is preferable and 0.5 cal/(s)(cm$^2$)(° C./cm), or greater, is more preferable As for the material of such a heat sink, materials wherein metal plating, such as of silver, palladium, or gold, or solder plating is impressed on a copper or phosphor bronze surface are preferably used. In the case of silver plating, the reflectance of light emitted from the light emitting element becomes high and the efficiency of the light output of the light emitting device increases, which is preferable.

The thickness of the heat sink is adjusted to an appropriate size in order to increase the heat radiation of the LED chip, taking the properties of the LED chip into consideration. In addition, the area on top of the heat sink is approximately the same size as the semiconductor element that is mounted thereon wherein the heat sink is adjusted so that the positive and negative conductive wires do not make contact with the heat sink. Alternately, the directions of upper die 401 and lower die 402 are reversed vis-à-vis the vertical direction in the present mode so that the center portion of the conductive wires hangs down below the heat sink and, then, the mold member may be formed. By doing the above, it is possible to form a light emitting device having a high manufacturing yield wherein short circuiting is prevented. The heat sink may be of any form, such as of a columnar form, of a prismatic form, or the like, and in the case wherein a recess is provided in the upper portion of the heat sink for mounting an LED chip, it is preferable for this recess to have an opening that is broader closer the top. According to this configuration, light emitted from the light emitting element is reflected from the sides of the recess so as to directed in the frontal direction of the light emitting device and, therefore, it is possible to increase the efficiency of the light output of the light emitting device. In addition, in the case that a light receiving element is utilized as the semiconductor element, the light entering into the light receiving device is reflected from the sides of the recess so as to be directed in the direction of the light receiving element and, therefore, it is possible to increase the sensitivity of the light receiving device.

Sides inclined relative to the optical axis of the light emitted by the LED chip and facing toward the opening (hereinafter referred to as "sides a") and sides of which the angle of inclination vis-à-vis the optical axis is smaller than that of sides a (hereinafter referred to as "sides b") may be formed as the respective sections of the sides of the recess.

By providing a recess having such sides, light from the light emitting element directed toward sides a and light directed toward sides b, respectively, are reflected according to differing angles of reflection from the sides of the recess and, therefore, the efficiency of the light output of the light emitting device increases and, in addition, it is possible to increase the distribution of the luminous intensity in the desired direction.

Furthermore, it is preferable for the heat sink to be provided with a protrusion on the side that makes contact with the package support body. This protrusion may have an arbitrary form and a plurality of protrusions may be provided on the entire surface of a side of the heat sink or may be provided in a ring form surrounding the side of the heat sink.

According to such a heat sink configuration, the thermoplastic resin, which is the material of the package support body, hardens around the protrusion(s) at the time of formation of the package support and, therefore, the heat sink does not easily come off from the package in the light emitting device according to the present invention and it becomes possible to gain a light emitting device of a high reliability. In the light emitting device according to a prior art, a heat sink formed in a separate process is adhered to a package using an insulating adhesive, or the like, and, therefore, the efficiency of the task is low and a problem arises such that the adhered heat sink easily comes off from the package, so that a light emitting device of a high reliability cannot be gained.

(Conductive Wires 106)

The conductive wires are conductors for connecting the electrodes of the semiconductor element to the lead electrodes. Here, in the case wherein the electrodes of the semiconductor element and the lead electrodes are placed so as to face each other and, thereby, to be directly connected to each other, the conductive wires are not essential components of the present invention.

Conductive wires 106 are required to have good ohmic properties and mechanical connection properties vis-à-vis the electrodes of LED chip 101, good electrical conductivity and good thermal conductivity. As for the concrete value of the thermal conductivity, 0.01 cal/(s)(cm$^2$)(° C./cm), or greater, is preferable and 0.5 cal/(s)(cm$^2$)(° C./cm), or greater, is more preferable. In addition, the diameter of conductive wires 106 is preferably Φ10 μm, or greater, and Φ45 μm, or less, taking the task efficiency into consideration. Conductive wires made of metal, such as gold, copper, platinum, aluminum, or the like, or an alloy using these are concretely cited as the conductive wires 106. Such conductive wires 106 allow the electrodes of the respective LED chips 101 and inner leads to be easily connected to each other by means of a wire bonding apparatus. Here, in the case wherein wire bonding is carried out on an LED chip having positive and negative electrodes, making up a pair, on the same surface, these positive and negative electrodes are connected to the positive lead electrode and to the negative lead electrode, respectively. In addition, in the case wherein LED chip 101 is placed and secured and, at the same time, is electrically connected to inner lead electrodes, or the like, within the package in the configuration, the electrode, either the positive or negative electrode of LED chip 101, that is not yet electrically connected to a lead electrode, or the like, is connected to one of either the positive lead electrode or the negative lead electrode by means of wire bonding. A plurality of conductive wires 106 may be utilized for the connections of the positive electrode and of the negative electrode to the respective lead electrodes. By doing the above, the risk of wire disconnection is spread over the respective wires and, thereby, a semiconductor device of a high reliability can be gained. That is to say, even if some wires among the plurality of wires, become disconnected, and become nonconductive, as a result of the effect of thermal stress from the mold member, it is possible to achieve electrical conduction with the remaining wires that are not disconnected. In addition, there are cases wherein two, or more, LED chips having positive and negative electrodes, making up pairs, on the same surfaces are mounted and wherein the positive electrode or the negative electrode of one mounted LED chip is divided into several pieces according to the modes of the present invention. In such cases, it is possible to carry out connections by means of wire bonding on the respective electrodes or on the divided electrode so that they are connected in parallel.

(Mold Member 107)

Mold member 107 can be provided in order to protect LED chip 101, conductive wires 106, a coating part including fluorescent material in grain forms, and the like, from external influence or in order to provide certain optical characteristics to the light emitting device in accordance with the applications of the light emitting diode. In addition, a portion of mold member 107 extends between, at least, the package support body and the side of inner lead 105b in the present mode. In the case wherein such an extending portion does not exist, this mold member easily comes off from the package when a force is applied to the mold member in the direction of the front surface of the light emitting device. In the case wherein an extending portion as in the present mode, is provided, however, the mold member can be prevented from coming off of the package because this extending portion extends in the direction perpendicular to the force.

Mold member 107 can be formed of a variety of resins, glasses, or the like. As for the concrete material of the mold member 107, primarily thermosetting resins having excellent weather resistance and light transmittance such as epoxy resin, urea resin, silicon resin, and the like, and glasses are preferably used. Here in the present specification, thermosetting resin means a plastic that hardens when it is heated under high pressure. The thermosetting resin cannot be remelted or reformed once it has hardened without damaging the initial properties. As for such thermosetting resins, an epoxy-based resin, a melamine-based resin, a phenol-based resin and a urea-based resin, for example, are cited. Such a material of the mold member is injected into a space 403 to be filled at the softening point ("softening point" in the present specification means a temperature wherein a hardened thermoplastic resin starts to soften when heated), or higher, of the thermoplastic resin that is utilized as the material of the package support body and at the hardening temperature ("hardening temperature of a thermosetting resin" in the present specification means a temperature wherein a thermosetting resin material in a solid form becomes liquid and completely solidifies after a specific period of time has elapsed) of the thermosetting resin utilized as the material of the mold member. At this time, the thermoplastic resin forming the package support body is softened in the die made of steel and, therefore, the package support body makes very close contact with the die so that the thermosetting resin in a liquid form made to flow into the die does not leak out from the area where the die and the package support body make contact. In addition, it is possible for the contact between the die and the top surface of the lead frame to be restricted to the minimum by reducing the area of the top surface of the lead frame so as not to cause a gap between the die and the top surface of the lead frame. Accordingly, the formation of the mold member by softening the material of the package support body, together with the process unique to the present invention wherein the material of this mold member is made to flow into the die from the upper portion of the package by means of an injection frame, makes it possible to completely prevent the occurrence of resin burrs at positions other than at portions wherein the mold member is formed, in particular, the occurrence of resin burrs on the outer periphery of the package.

In addition, a dispersing agent can be included in the mold member so that the directivity of light from LED chip 101 is reduced and the view angle is increased. In addition, it is also possible to form the mold member into a convex lens form, a concave lens form, or the like, of a variety of sizes, taking into consideration the distribution of the luminous intensity, condensation of light that enters into, or is emitted from, the semiconductor element. Furthermore, it is possible to form a lens, of which the longitudinal cross section of the mold member viewed in the direction of light emission is elliptical, for the purpose of widening the distribution of the luminous intensity in a predetermined direction relative to the light emitting device. The formation of the mold member in such a variety of forms becomes possible by changing the form and the size of the molding die to the desired form and size. Conventionally, a potting process is carried out wherein the material of the mold member is dropped onto a place wherein the mold member is installed and, then, is hardened and, according to this potting process, formation wherein the desired form and desired size are changed as described above is difficult because of the limitation of the surface tension of the material of the mold member that is applied by dropping in a liquid form.

(Fluorescent Material)

It is possible to utilize a fluorescent material in order to gain the desired color of emitted light by converting the wavelength of the light emitted from the light emitting element in the light emitting device according to the present invention. Such a fluorescent material is included in the mold member or is adhered to the surface of the light emitting element with an adhesive made of a light transmitting inorganic material.

A fluorescent material in grain form that is excited by light emitted from the semiconductor light emitting layer of LED chip 101 so as to emit light is used as the fluorescent material of the present invention. In the case wherein light emitted by LED chip 101 and light emitted by the fluorescent material in a grain form are in a complementary relationship, white light can be emitted by mixing the respective colors of light.

Concretely, cases are cited wherein light from LED chip 101 and light emitted by the fluorescent material in a grain form excited by light from LED chip 101 correspond to the three primary colors of light (red, green and blue), respectively, and wherein blue light is emitted by LED chip 101 and yellow light is emitted by the fluorescent material in a grain form excited by the blue light.

As for the color of light emitted by light emitting diode, the ratio of the fluorescent material in a grain form to the inorganic member working as an adhesive of the fluorescent material in a grain form, such as of a variety of resins or glasses, the deposition time of the fluorescent material in a grain form, the form of the grain of the fluorescent material, and the like, can be adjusted and the wavelength of light emitted by the LED chip can be selected and, thereby, an arbitrary tone of white light, such as from a light bulb, can be provided. It is preferable for the mold member outside of the light emitting diode to efficiently transmit the light from the LED chip as well as the light from the fluorescent material.

As for concrete examples of fluorescent materials in a grain form, cadmium zinc sulfide activated by copper and an yttrium aluminum garnet-based fluorescent material activated by cerium are cited. In particular, $(Re_{1-x}Sm_x)_3(Al_{1-y}Ga_y)_5O_{12}$:Ce ($0 \leq x < 1$, $0 \leq y \leq 1$, here, Re is at least one type of element selected from a group consisting of Y, Gd and La), or the like, is preferable for high brightness or at the time of utilization for a long period of time. In the case wherein $(Re_{1-x}SM_x)_3(Al_{1-y}Ga_y)_5O_{12}$:Ce is specifically used for the fluorescent material in a grain form, a light emitting diode can be gained that has a sufficient resistance to light even in the case wherein it is placed so as to make contact with, or in the vicinity of, the LED chip and that is highly efficient even when the illumination of the radiation (Ee) is 3 W·cm$^{-2}$, or greater, and is 10 W·cm$^{-2}$, or less.

The fluorescent material of $(Re_{1-x}Sm_x)_3(Al_{1-y}Ga_y)_5O_{12}$:Ce has a garnet structure and, therefore, has a high resistance to heat, light and moisture and gains an excitation spectrum having a peak in the vicinity of 470 nm. In addition, this fluorescent material emits light having a peak in the vicinity of 530 nm and having a broad spectrum with a skirt up to 720 nm. In addition, the wavelength of the emitted light is shifted towards shorter wavelengths by replacing a portion of Al in the composition with Ga and the wavelength of the emitted light is shifted towards longer wavelengths by replacing a portion of Y in the composition with Gd. It is possible the sequentially adjust the color of the emitted light by changing the composition as described above. Accordingly, ideal conditions for converting the emitted light to white light by utilizing blue light emitted by a nitride semiconductor are provided such that the intensity on the long wavelength side is changed sequentially according to the composition rate of Gd.

Such fluorescent material is gained by sufficiently mixing, according to a stoichiometric ratio, oxides or compounds easily converted to oxides at a high temperature, which are utilized as materials of Y, Gd, Ce, Sm, Al, La and Ga. Alternately, mixed materials are attained by mixing coprecipitated oxides which is obtained by coprecipitate the solution gained by dissolving the rare earth metal elements of Y, Gd, Ce and Sm into acid with oxalic acid according to a stoichiometric ratio and sinter the obtained material, aluminum oxide and gallium oxide. This is mixed with an appropriate amount of fluoride, such as ammonium fluoride, as a flux and, then, is put in a crucible to be sintered in the air for from two to five hours at a temperature in the range of from 1350° C. to 1450° C. and, thereby, a sintered article is gained. Next, the sintered article is ball milled in water and is washed, separated, dried and, finally, is passed through a sieve and, thereby, the desired fluorescent material in a grain form can be gained.

The fluorescent material in a grain form in the light emitting diode of the present invention may be gained by mixing two, or more, types of fluorescent materials in a grain form. That is to say, two, or more, types of fluorescent materials of $(Re_{1-x}Sm_x)_3(Al_{1-y}Ga_y)_5O_{12}$:Ce wherein the contents of Al, Ga, Y, La and Gd or of Sm differ from each other, are mixed with each other so as to increase the wavelength components of RGB. In addition, at present some semiconductor light emitting elements cause dispersion in the wavelengths of the emitted light and, therefore, two, or more, types of fluorescent materials are mixed and adjusted so that the desired white light can be gained. Concretely, the amounts of fluorescent materials, having different chromaticity points, are adjusted and, then, included in accordance with the wavelength of the emitted light of the light emitting element and, thereby, light corresponding to an arbitrary point in the chromaticity diagram, gained by connecting points corresponding to the fluorescent materials and the light emitting element, can be emitted.

(Dispersing Agent)

It is possible to include a dispersing agent in the mold member according to the present mode in order to increase the brightness of the light emitted by light emitting device. The dispersing agent included in the mold member reduces scattering absorption of light, from among the light emitted by the light emitting element, emitted toward the light observation side and scatters a large portion of the light directed to the sides of the light reflecting layer and, thereby, increases the brightness of the light emitted by the light emitting device. As for such a dispersing agent, inorganic material, such as barium oxide, barium titanate, barium oxide, silicon oxide, titanium oxide and aluminum oxide, and organic material, such as melamine resin, CTU guanamine resin and benzoguanamine resin are preferably used.

A variety of coloring agents can be added in order to provide a filtering effect for eliminating unnecessary wavelengths from the external light or from the light emitting element in the same manner as above. Furthermore, a variety of fillers can be included in order to mitigate the internal stress of the resin.

(Fillers)

Furthermore, fillers may be included together with the fluorescent material, or in place of the fluorescent material, in the mold member according to the present invention. Concretely, though the materials are the same as of the dispersing agent, the fillers have a median diameter that differs from that of the dispersing agent, and the fillers in the present specification are grains having a median diameter of 5 $\mu$m, or greater, and 100 $\mu$m, or smaller. In the case that fillers having such a grain diameter are included in the light transmitting resin, dispersion in the chromaticity of the light emitting device is improved due to the effect of light scattering and, in addition, resistance to thermal shock of the light transmitting resin can be enhanced. In addition, it is preferable for the fillers to have a grain diameter and/or form similar to those of the fluorescent material. Here, a similar grain diameter in the present specification indicates the case wherein the difference between the respective grains in median diameter is less than 20%, and a similar form indicates the case wherein the difference between the respective grains in the value of circularity (circularity=length of circumference of a circle having an area equal to the area of projection of a grain/length of circumference of the projection of the grain) representing the degree of proximity to a circle is less than 20%. By using such fillers, the fluorescent material and the fillers interact with each other so that the fluorescent material can be well dispersed in the resin and color heterogeneity can be controlled. Furthermore, the median diameters of the grains of the fluorescent material and of the fillers are preferably from 15 µm to 50 µm and, more preferably, from 20 µm to 50 µm, and the respective grains can be placed at desired intervals by adjusting the diameters of the grains in such a manner. Thereby, the output path of the light is secured and reduction in chromaticity due to the inclusion of fillers can be restricted while the properties of direction can be improved. In addition, when the fluorescent material and fillers having grain diameters in such a range are included in a light transmitting resin and the sealing member is formed according to stencil printing, clogging of dicing blades in the dicing process is overcome after the sealing member has hardened so that dresser effects are gained and productivity is increased.

[Embodiments]

In the following, the embodiments according to the present invention are described in detail. Here, the present invention is not, of course, limited solely to the embodiments shown below.

[Embodiment 1]

As shown in FIG. 3, package support part 104 utilized in the formation process of the present embodiment is formed at the center of frame 300 of a thermoplastic resin according to an injection molding process so that the upper surface of injection frame 305, through which the resin passes at the time of injection of the mold material, and the main surface of package 104 (surface existing at the highest level from among surfaces on the side in which recess 302 is created, except for the surface formed of notches 201, recess 302 and gates 306) are included in the same plane. In addition, notches 201 provided in the upper portion of package support part 104 are recesses having dimension approximately equal to the dimensions of the tips of the lead frames (air vent frame 303 and injection frame 305) and the tips of the lead frames are placed so as to make close contact with, and so as to be caught by, notches 201. Accordingly, the tips can easily be removed from notches 201 in the process wherein the lead frames are separated from the external frame. Furthermore, gates 306 that become paths for the mold material to be injected are provided at the tips of notches 201 in the upper portion of package support part 104 so as to face recess 302.

In the following, the semiconductor device of the present invention, in particular, a process for forming a light emitting device, is described in sequence in reference to the drawings.

(Step 1)

First, frame 300 utilized in the present embodiment, of which a portion is shown in FIG. 3, is fabricated. A punching process is carried out on a metal plate, of which the main component is copper, so as to form a pair of lead electrodes 301, separated from each other, protruding from external frame 304 and facing in the same direction and so as to form a pair of lead frames (air vent frame 303 and injection frame 305), separated from each other, protruding from external frame 304 and facing in the same direction, which is different (by 90 degrees in the present embodiment) from the direction in which the lead electrodes are aligned.

(Step 2)

Furthermore, a press process is carried out on the lead electrodes 301 on the main surface side of package support part 104, which is formed in the subsequent step so that the tip portions of the pair of lead electrodes 301 are placed below the pair of lead frames. Finally, silver plating is carried out so as to complete frame 300.

(Step 3)

Next, injection formation of package support part 104 is described, as shown in FIG. 3. In the present embodiment, a first space to be filled, including heat sink 102 having a protrusion in a ring form around the outer periphery and the tip portions of lead electrodes 301 that form inner lead electrodes 105, is created by coupling an upper die and a lower die, which can be engaged with this upper die, with a metal plate placed therebetween. Here, the upper die has a protrusion for creating recess 302 and gates 306 in an integrated manner in the package and has portions for supporting lead electrodes inserted into the first space to be filled. On the other hand, the lower die has a recess for forming the sides of the package. In addition, these lead frames are supported by notches provided so as to face the sides of the upper die and by sidewalls of the lower die so that the front surfaces of the tip portions of the lead frames protruding into the first space to be filled make contact with the sides of the protrusion for forming gates 306. Furthermore, predetermined surfaces of the upper die make contact with the upper surfaces of the lead frames so that the upper surfaces of the lead frames and the main surface of package support part 104 are included in the same plane.

After that, a polyphthalamide resin, which is a thermoplastic resin material, in a liquid form is injected into the first space to be filled from the mounting surface side and, then, is cooled so as to form package support part 104, having recess 302 of which the opening becomes broader closer to the top and having heat sink 102 and inner lead electrodes 105b, at a predetermined position of frame 300 so that package support part 104 and frame 300 are integrated. Here, the thermal expansion coefficient of the package support part at the time after hardening is from $2.3 \times 10^{-5}$ (1/° C.) to $8.6 \times 10^{-5}$ (1/° C.). In addition, in the present embodiment, a material gained by including an appropriate amount of glass fiber in a polyphthalamide resin is utilized as a material of the package support part. Such a material exhibits better properties than does a material not including glass fiber concerning rigidity, strength, dimensional stability, heat resistance, chemical resistance, ease of processing, ease of reception of deposition, resistance to moisture absorption and electrical properties and, thereby, is appropriate for utilization as a material of the package support part of the light emitting device according to the present invention.

(Step 4)

Next, LED chip 101 and heat sink 102 are adhered to each other with a thermosetting resin, a light transmitting inorganic material, a metal solder, or the like. Concretely, an epoxy resin, an acryl resin or imide resin, a silica sol, a eutectic solder such as Au—Sn, and the like, are cited. In addition, an Ag paste, a carbon paste, an ITO paste, a metal bump, or the like, preferably is used in order to secure LED chip 103 in place and in order to provide an electrical connection with lead electrodes 104 within the package.

(Step 5)

Wire bonding is carried out in order to connect the positive and negative electrodes of LED chip 101 to inner leads 105b by means of conductive wires 106.

(Step 6)

Figure 4:
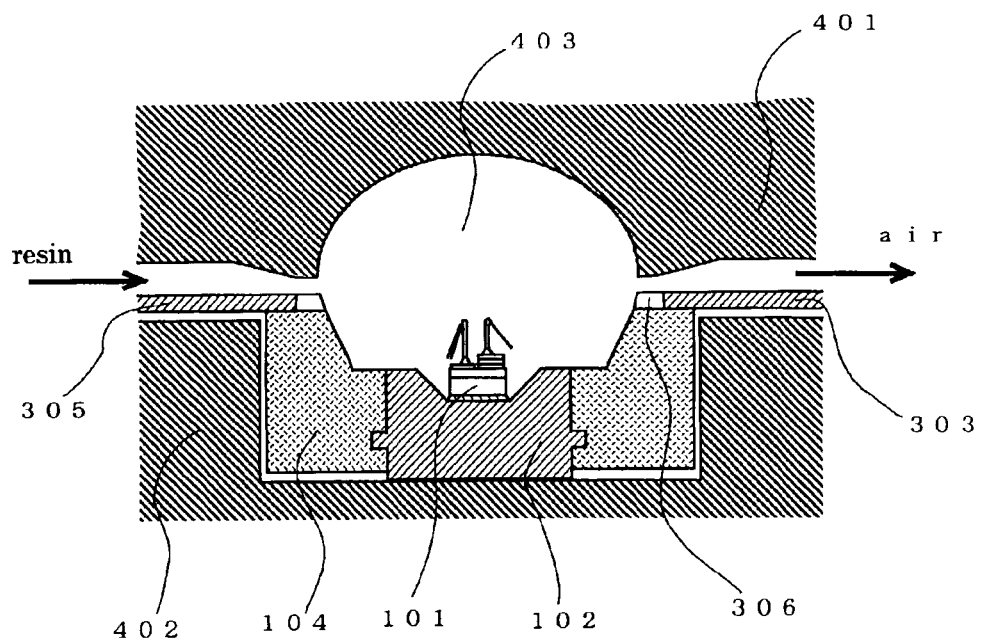
FIG. 4 is a schematic view showing a mold member forming process of the present invention.

In the following, the formation of the mold member of the present invention according to a transfer molding process is described in reference to FIG. 4. A predetermined surface of upper mold 401 is pressed against, and makes close contact with, the surface that includes the upper surface of the frame and the main surface of package 104. The upper surface of the frame and the main surface of package 104 are formed so as to be included in the same plane and, therefore, the closeness of the contact between the upper die and the surface that includes the upper surface of the frame and the main surface of package 104 can be increased so that resin leakage is prevented. Upper die 401 is processed to have a form with a trench that guides the mold material to be injected in the liquid form, so that the mold material flows along the upper surface of injection frame 305 up to gates 306, with a trench that guides a gas, which is replaced with the mold material in the second space to be filled and which is expelled to the outside, so that the gas flows along the upper surface of air vent frame 303 and with recesses and protrusions for forming the mold member into the desired form. Furthermore, upper die 401 is placed so as to face the respective upper surfaces of lead frames and gates 306 as well as recess 302. At this time, a gate 306 and the upper surface of injection frame 305 form a path through which the mold material, in a liquid form, passes and, simultaneously, second space 403 to be filled, which includes the recess on the main surface side of package support part 104, is also formed. Furthermore, lower die 402, provided with a recess in which the lower portion of package support part 104 is contained without a gap, is pressed so that the entirety of package support part 104 and frame 300 is placed, compressed and secured between upper die 401 and lower die 402.

Next, the temperature is set at the softening point, which is 120° C., or higher, of the polyphthalamide resin utilized as the material of the package support part and at the hardening temperature, which is 150° C., or lower, of the epoxy resin utilized as the mold material and, after that, the epoxy resin is injected into the path so as to flow toward the space to be filled until the epoxy resin has flown out of the air vent frame and, thereby, the space 403 to be filled is filled with the epoxy resin. At this time, the polyphthalamide resin of package support part 104 is softened and, therefore, package support part 104 makes extremely close contact with the die so that the epoxy resin that has flown in does not leak out from the portion where the die and the package support part make close contact with each other. Accordingly, it is possible to completely prevent the occurrence of resin burrs on the outer periphery of the package at the time of the molding process. In addition, the air that existed in second space 403 to be filled is replaced with the epoxy resin that has flown in and expelled from air vent frame 303. Thereby, it is possible to prevent the occurrence of gas bubbles in the mold member.

In addition, gaps occur between the softened package support part and the main surface of inner leads 105b as well as between the package support part and the sides of heat sink 102 when the package support part is held between the dies while pressure is applied in upward and downward directions at the set temperature so that the epoxy resin, having a high fluidity, enters into these gaps. At this time, the sides of the package support part are held in the direction of the sides of the lead frame with an appropriate force by the dies. By doing the above, the epoxy resin, having a high fluidity, is made to enter into the gaps so that extending portions 107a can be formed while the epoxy resin is prevented from leaking out from the areas of contact between the sides of package support part 104 and the interfaces between outer leads 105a and inner leads 105b. Here, the sides of the package may be held by the hanger lead provided in the external frame with an appropriate force in the direction of the sides of the lead frame.

The temperature of the dies is set at the hardening temperature, which is 150° C., of the epoxy resin and, the mold member is formed after a predetermined period of time of hardening has elapsed. Here, the thermal expansion coefficient of the epoxy resin after hardening is from 14.5 (1/° C.) to 18.5 (1/° C.).

(Step 7)

Finally, package support part 104 and the lead frames are separated from the external frame and, then, outer lead electrodes 105a are bent into the desired form so that light emitting device 100 of the present invention is completed.

In the present embodiment, the occurrence of resin burrs on the outer periphery of the package can be completely prevented. Accordingly, resin burrs do not hinder the formation of electrodes so that the task efficiency in the subsequent steps can be increased. In addition, problems do not arise wherein the external appearance of the light emitting device is negatively affected. Furthermore, the light emitting element, together with the mold portion or the mold member, does not easily come off of the package and, therefore, a semiconductor device of a high reliability can be formed.

[Embodiment 2]

A semiconductor device is formed in the same manner as in Embodiment 1 except for the utilization of a variety of thermoplastic resins having softening points in the range of 85° C. to 120° C. as the thermoplastic material.

By doing the above, the occurrence of resin burrs can be prevented, the task efficiency can be increased so that a semiconductor device of a high reliability can be formed.

[Embodiment 3]

Figure 5:
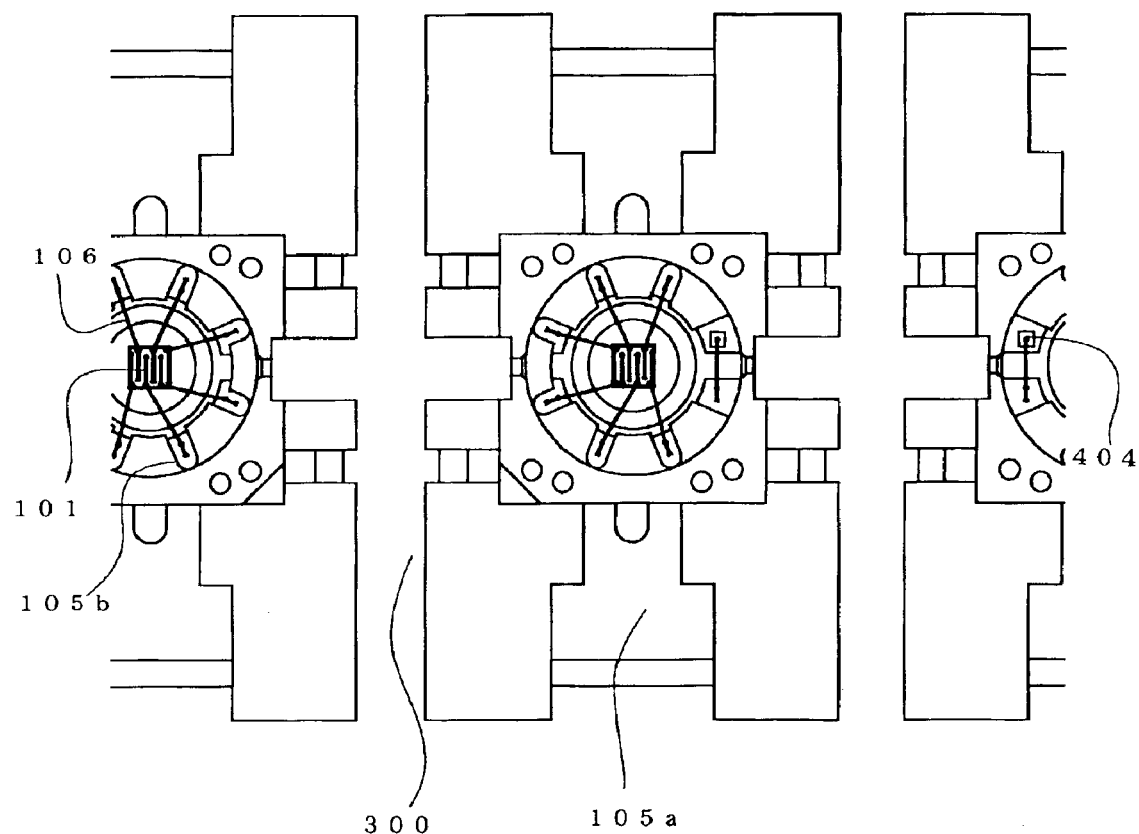
FIG. 5 is a schematic top view showing one embodiment of the present invention.

FIG. 5 is a schematic top view showing the state of a light emitting device according to the present Embodiment 3 after an LED chip has been provided in a containment part of the package and wiring has been carried out before mold member 107 is formed, wherein the configuration of the bonding parts differs from that of Embodiment 1.

Here, the main surface of the heat sink is exposed from the bottom of the recess in the package according to the present Embodiment 3 in the same manner as in Embodiment 1 and LED chip 101 is provided in the recess created in the main surface of this exposed heat sink wherein, as shown in FIG. 5, the positive electrode and the negative electrode of this LED chip 101 are connected to the lead electrodes.

Here, in the present Embodiment 3, the positive electrode and the negative electrode, respectively, of LED chip 101 have a plurality of bonding parts and each of these pluralities of bonding parts is wire bonded to an inner lead electrode 105b by means of a conductive wire 106.

In addition, the plurality of bonding positions in the main surface of inner lead electrodes 105b is exposed from the bottom of the recess only in the portions necessary for bonding, while the spaces between the adjacent bonding positions are covered with the package support part extending from the sides of the recess so that the bonding positions are separated from each other.

That is to say, only the respective bonding positions for conductive wires 106 are exposed from package support part 104 on the main surface of inner lead electrodes 105b while the regions other than the regions necessary for bonding of conductive wires 106 are covered to an appropriate thickness with the material forming the package support part. Here, the dimensions of the exposed areas of inner lead electrodes 105b are limited to the minimum dimensions required, taking the performance of the bonding apparatus, the dimensions of conductive wires 106, and the like, into consideration. A plurality of exposed areas of inner lead electrodes 105b can be provided at approximately equal intervals in the periphery portion of recess 302 in accordance with the number of conductive wires 106, and conductive wires 106 from the respective surfaces of the electrodes of the semiconductor element are attached in a radial form. The effects of thermal stress applied between the mold member and the conductive wires can be dispersed by providing conductive wires in the manner so that a semiconductor device of a high reliability can be gained.

In addition, a protective element 404 is mounted on a portion of an exposed surface of an inner lead electrode 105b so as to be in the condition wherein the element conducts electricity to inner lead electrode 105b and the other electrode of protective element 404 is connected to inner lead electrode 105b by means of a conductive wire in the same manner as above. The light emitting device according to the present embodiment is gained by forming mold member 107 on the package shown in FIG. 5 in a process that is the same as in the embodiments.

A plurality of exposed surfaces for wire bonding is formed so as to be limited to the bonding positions in the present embodiment and, thereby, the effects of the flow of the resin to be injected can be limited to the minimum in bonding portions between inner lead electrodes 105b and conductive wires 106 at the time the resin for the formation of the mold member is injected into the space to be filled so that bonding strength can be maintained and, therefore, the manufacturing yield of semiconductor devices is increased. In addition, even in the case wherein some conductive wires among the plurality of conductive wires become disconnected and nonconductive due to receiving the effects of thermal stress from the mold member, it is possible to achieve electrical conduction with the remaining conductive wires that are not disconnected and, therefore, a semiconductor device of a high reliability can be gained.

[Embodiment 4]

Figure 6:
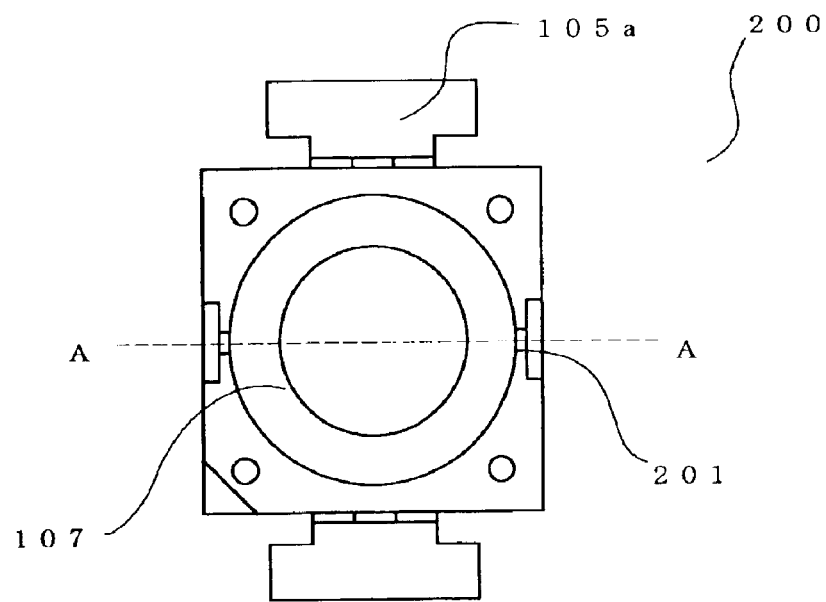
FIG. 6 is a schematic top view showing one embodiment of the present invention.
Figure 7:
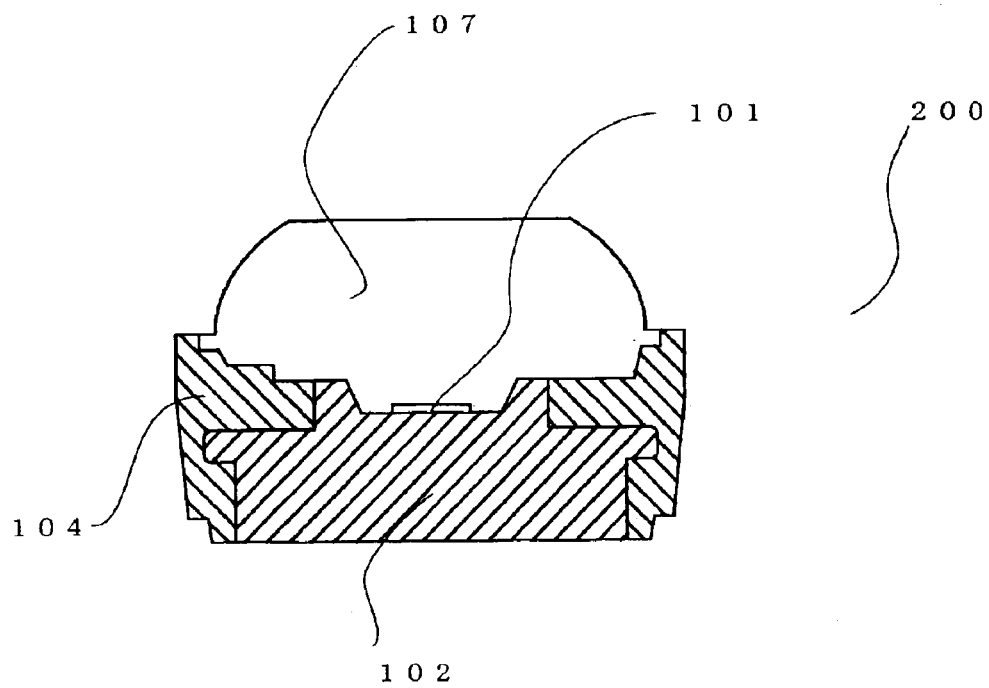
FIG. 7 is a schematic cross sectional view showing one embodiment of the present invention.

FIG. 6 shows a schematic top view of a light emitting device 200 according to the present embodiment and FIG. 7 shows a cross sectional view along dotted line AA of FIG. 6. Here, light emitting device 200 has a mold member 107, as shown in FIGS. 6 and 7, formed to have a different form from in Embodiment 1. That is to say, it is formed so that the front side of light emitting device 200, which is in the upper portion of mold member 107, becomes a plane approximately parallel to the bottom surface of the recess in package 104.

It is possible to form a light emitting device with light distribution properties having a plurality of peaks in the light intensity distribution vis-à-vis the view angle by forming the mold member in the manner. It is possible to utilize such a light emitting device as a light source for a signal.

[Embodiment 5]

Figure 8:
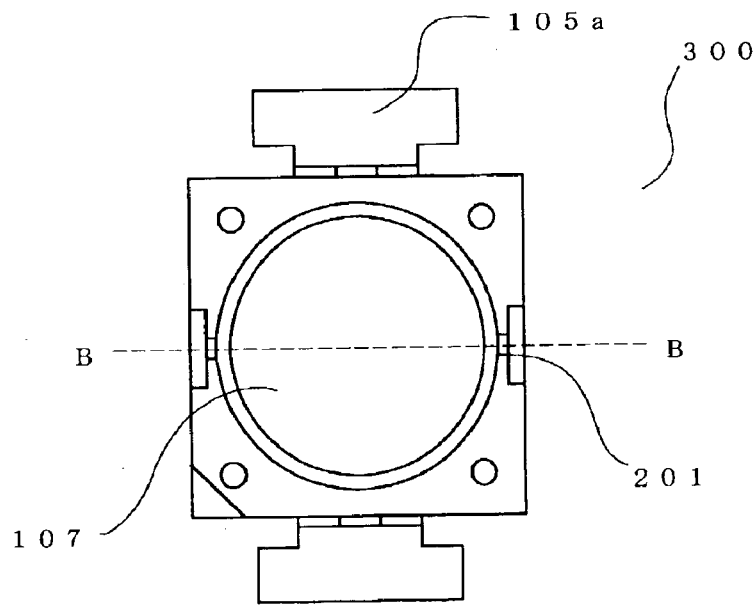
FIG. 8 is a schematic top view showing one embodiment of the present invention.
Figure 9:
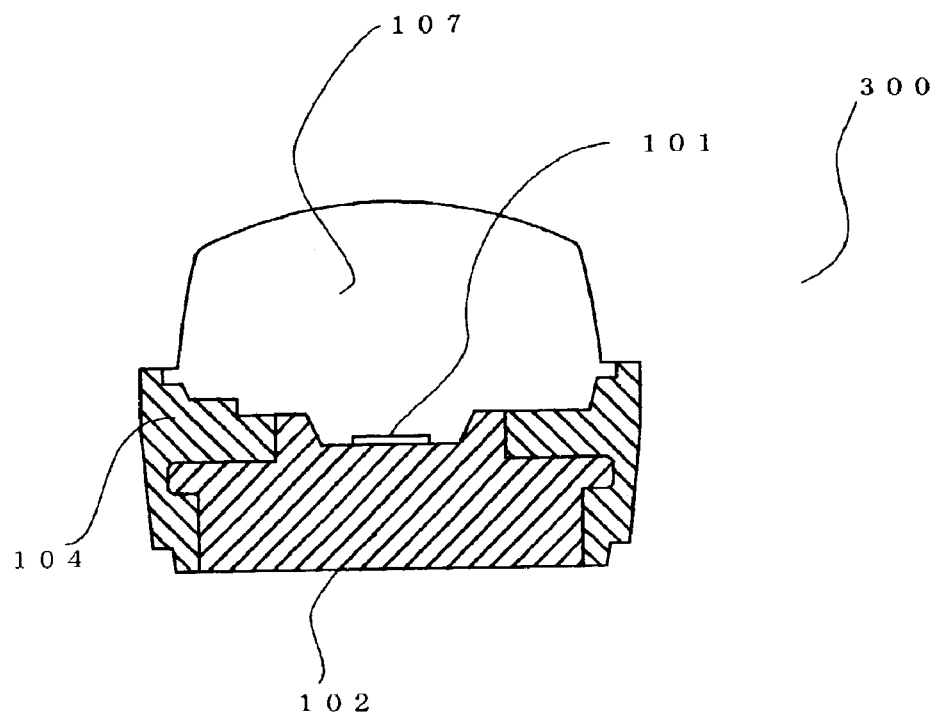
FIG. 9 is a schematic cross sectional view showing one embodiment of the present invention.

FIG. 8 shows a schematic top view of a light emitting device 300 according to the present embodiment and FIG. 9 shows a cross sectional view along dotted line BB of FIG. 8. Here, light emitting device 300 has a mold member 107, as shown in FIGS. 8 and 9, formed to have a different form from in the other embodiments. That is to say, the entire curved surface of mold member 107 is formed of a plurality of curved surfaces having different curvatures.

It is possible to form a light emitting device with light distribution properties having a plurality of peaks in the light intensity distribution vis-à-vis the view angle by forming the mold member in the manner. It is possible to utilize such a light emitting device as a light source for a signal.

What is claimed is:

1. A semiconductor device comprising:

a semiconductor element;

a package having a recess for housing the semiconductor element, said package comprising lead electrodes and a package support part supporting the lead electrodes whereby tip portions of the lead electrodes are exposed from a surface of the recess;

a mold member for sealing the semiconductor element in the recess, wherein the mold member extends to at least over a portion of the lead electrodes and a portion of the package support part, the package support part has notches in at least one pair of opposite sides of the package support part, and the notches reach the recess.

2. The semiconductor device according to claim 1, wherein the package further comprises a heat sink on which the semiconductor element is placed.

3. The semiconductor device according to claim 2, wherein the heat sink has a recess.

4. The semiconductor device according to claim 3, wherein the heat sink has a protrusion.

5. The semiconductor device according to claim 1, wherein the package support part is made of a thermoplastic material.

6. A semiconductor device according to claim 1, further comprising:

a plurality of conductors for connecting the lead electrodes and electrodes of the semiconductor element; and wherein surfaces of the tip portions are separated from each other by the package support part.

7. A semiconductor device comprising:

a semiconductor element;

a package having a recess for housing the semiconductor element, said package comprising a heat sink, lead electrodes and a package support part supporting the lead electrodes whereby tip portions of the lead electrodes are exposed from a surface of the recess, and a mold member for sealing the semiconductor element in the recess, wherein a back side of the heat sink is a portion of a mounting surface for mounting the package and the semiconductor element is placed on a surface of the heat sink, and wherein the mold member extends to at least over a portion of the lead electrodes and a portion of the package support part, wherein the package support part has notches in at least one pair of opposite sides of the package support part, and the notches reach the recess.

8. The semiconductor device according to claim 7, wherein said mold member has an upper surface substantially parallel to a bottom surface of the recess.

9. The semiconductor device according to claim 7, wherein the mold member has at least one curved surface.

10. The semiconductor device according to claim 7, wherein the package support part is made of a thermoplastic material comprising glass fiber.

11. The semiconductor device according to claim 10, wherein the tip portions of said lead electrodes are exposed to form a substantially circular pattern.

12. The semiconductor device according to claim 7, further comprising:
   a plurality of conductors for connecting between the lead electrodes and electrodes of the semiconductor element; and wherein surfaces of the tip portions are separated from each other by the package support part.

13. The semiconductor device according to claim 12, wherein said conductors are connected between exposed areas of said lead electrodes and electrodes of the semiconductor element in a substantially radial pattern.

14. The semiconductor device according to claim 7, wherein said mold member extend from said recess to said notches.

15. The semiconductor device according to claim 7, further comprising a notch at a top of a side wall different from the sides where said lead electrodes penetrate.

16. The semiconductor device according to claim 7, wherein said mold member comprises a fluorescent material.

17. The semiconductor device according to claim 7, wherein said mold member comprises a material selected from the group consisting of dispersing agent, fillers and coloring agent.

* * * * *